(12) United States Patent
Brown

(10) Patent No.: US 6,351,427 B1
(45) Date of Patent: Feb. 26, 2002

(54) STORED WRITE SCHEME FOR HIGH SPEED/WIDE BANDWIDTH MEMORY DEVICES

(75) Inventor: Brian L. Brown, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/207,119

(22) Filed: Dec. 7, 1998

Related U.S. Application Data

(60) Provisional application No. 60/069,045, filed on Dec. 10, 1997.

(51) Int. Cl.[7] ............................................... G11C 8/00
(52) U.S. Cl. ............................. 365/230.03; 365/189.05
(58) Field of Search ..................... 365/230.03, 230.02, 365/230.06, 230.08, 63, 189.05

(56) References Cited

U.S. PATENT DOCUMENTS

| | | | | |
|---|---|---|---|---|
| 5,570,319 A | * | 10/1996 | Santoro | 365/190 |
| 5,675,529 A | * | 10/1997 | Poole | 365/189.09 |
| 5,822,261 A | * | 10/1998 | Suh | 365/230.03 |
| 5,940,342 A | * | 8/1999 | Yamazaki | 365/230.03 |
| 5,946,266 A | * | 8/1999 | Iwamoto | 365/230.03 |
| 5,953,257 A | * | 9/1999 | Inoue | 365/189.05 |
| 6,016,270 A | * | 1/2000 | Thummalapally | 365/185.11 |

* cited by examiner

Primary Examiner—A. Zarabian
(74) Attorney, Agent, or Firm—Ronald O. Neerings; Wade James Brady, III; Frederick J. Telecky, Jr.

(57) ABSTRACT

A DRAM is disclosed that is capable of performing a rapid write-followed-by-read operation. In a preferred embodiment 400, the DRAM includes a plurality of memory banks (402-a-402n), a global write bus (424), and a global read bus (426). The global write and read buses (424 and 426) are coupled to each memory bank (402a-402n) by an associated local read/write circuit (428a-428n). In an initial write operation to a first memory bank (402a-402n), input data on the global write bus (424) are latched in a first local read/write circuit (428a-428n) associated with the first memory bank (402a-402n). In a subsequent read operation to a second memory bank (402a-402n), as data are output from the second memory bank (402a-402n) onto the global read bus (426) via a second local read/write circuit (422a-422n), the first local/read write circuit (422a-422n) is simultaneously writing the latched input data into the first memory bank (402a-402n).

35 Claims, 10 Drawing Sheets

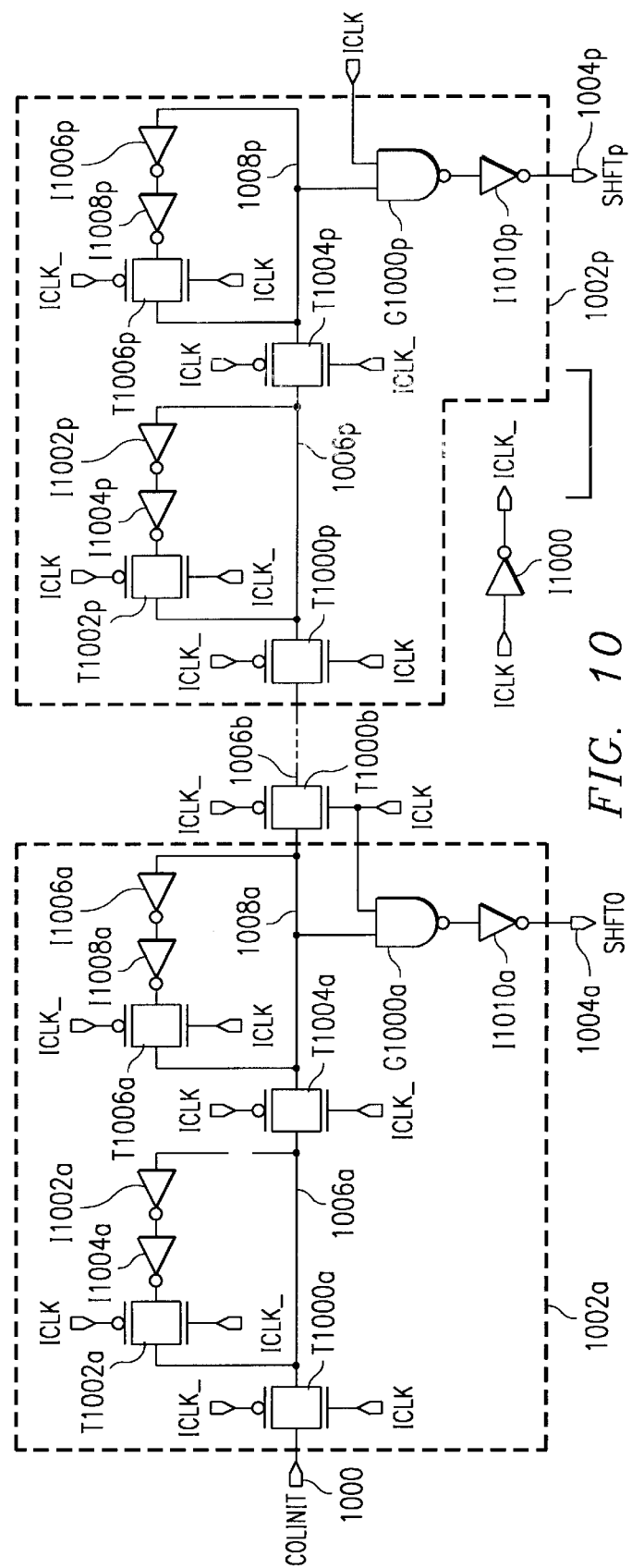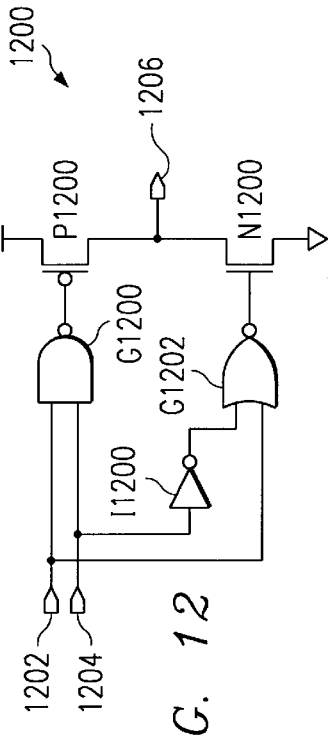
FIG. 10
FIG. 12

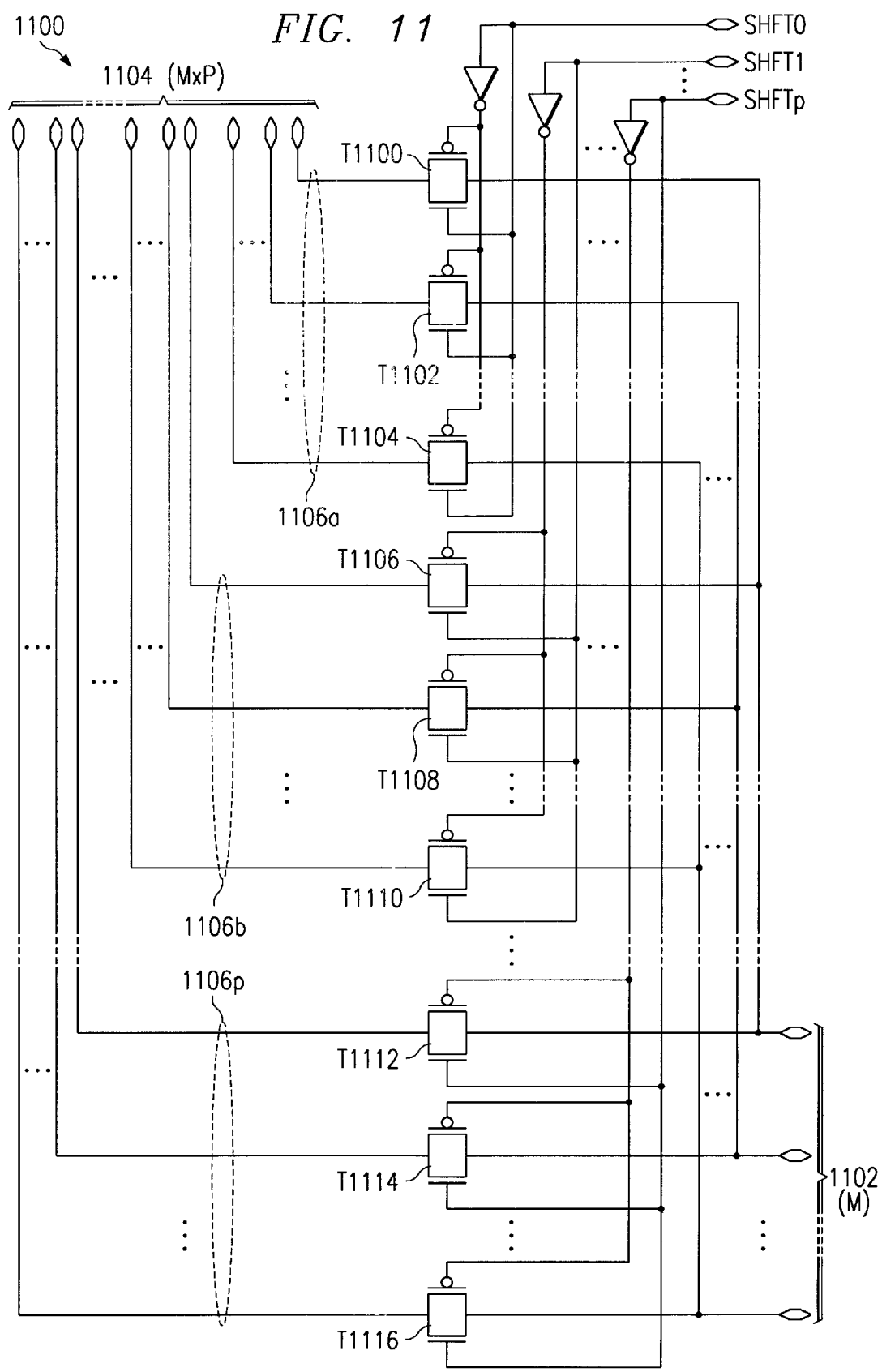

STORED WRITE SCHEME FOR HIGH SPEED/WIDE BANDWIDTH MEMORY DEVICES

This application claims priority under 35 USC §119(e)(1) of provisional application No. 60/069,045 filed Dec. 10, 1997.

TECHNICAL FIELD

The present invention relates generally to semiconductor memory devices, and more particularly to circuits for reading data from, and writing data into, the memory cells of a memory device.

BACKGROUND OF THE INVENTION

Computing systems typically include a computing device (a microprocessor for example) for manipulating data, and a storage device for storing data for use by the computing device. A common type of storage device is a semiconductor random access memory (RAM). In order to provide the best system performance in a computing device, it is desirable to allow the computing device to operate as fast as possible, and never be forced into an idle state while waiting to receive or store data. To achieve this result, it is important to provide a data storage device that will read and write data as quickly as possible. This gives rise to an important aspect of semiconductor memory device performance: the rate at which data can be read from, or written into the device (often referred as "bandwidth").

A typical RAM includes one or more arrays having memory cells arranged in rows and columns. The memory cells are accessed in read and write operations by way of a data bus. While large data buses can increase the bandwidth of a RAM, such an approach incurs the penalty of increasing the physical size of the RAM. For this reason, in RAMs which include multiple arrays, a data bus is typically a "global" bus. That is, the data bus is commonly connected to a number of arrays. Further, to reduce the area of a RAM, the data bus is often "shared." That is, the same set of lines within the data bus that are used to write data to the array, are also used to read data from the arrays. Thus, if a write operation is sending data into a memory array by way of the data bus, the write operation must be completed before a subsequent read operation can retrieve data from a memory array. Otherwise, the input and output data would both be on the data bus simultaneously, resulting in erroneous operation of the RAM. Any delay incurred between write and read operations is undesirable, because the computing device of the system may have to wait during such a delay in order to complete its computing function. The time period in which the computing system must wait for a data access operation of a storage device is often referred to as a wait state. Wait states are to be avoided, if possible, because they reduce the efficiency of system data bus timing, and hence reduce bandwidth.

To more clearly illustrate the occurrence of wait states that occur in a RAM operation, a block schematic diagram of a RAM is set forth in FIG. 1. The RAM is designated by the general reference character 100, and is shown to include a number of memory banks, beginning with a first memory bank 102a, a second memory bank 102b, and terminating in a last memory bank 102n. Each memory bank (102a–102n) can include more than one memory cell array. The storage locations within each memory bank (102a–102n) are accessed by corresponding row decoders (104a–104n) and column decoders (106a–106n). The row decoders (104a–104n) are each coupled to a row address buffer 108 by a row address bus 110. In a similar fashion, the column decoders (106a–106n) are each coupled to a column address buffer 112 by a column address bus 114. The RAM 100 further includes an address latch 116 for receiving and latching address information from a "multiplexed" address bus 118. The multiplexed address bus 118 is "multiplexed" in the sense that it receives either row address or column address information. The column address buffer 112 receives column address information from both address latch 116 and the multiplexed address bus 118.

The various functions of the RAM 100 are initiated by a command decoder 120. In response to information provided on a command bus 122 and/or the multiplexed address bus 118, the command decoder 120 activates a collection of control signals. Five control signals are illustrated in FIG. 1, a STORE signal, a READ signal, a WRITE signal, a COLINIT signal, and an ICLK signal. The STORE signal results in a column address being latched in the address latch 116. The READ signal initiates the internal read operation. The WRITE signal indicates an internal write function. It is noted that for the purposes of this discussion the distinction between a write operation and an internal write function should be kept in mind. The internal write function is the final step in a write operation, and includes the act of physically writing data into the memory cells of the array.

Referring once again to the control signals provided by the command decoder 120, it is noted that the COLINIT signal pulses high at the start of a column access. The ICLK signal pulses high for each bit in pre-fetch operation. Pre-fetch operations will be described below. The particular RAM 100 disclosed is a synchronous RAM, and so the RAM 100 operations are synchronous with an externally applied clock, shown as CLK.

Referring once again to FIG. 1, it is shown that the column decoders (106a–106n) are coupled to a write circuit 124 and a read circuit 126 by a shared data bus 128. The data bus is "shared" in that it is used for both read and write operations. The operation of the write and read circuits (124 and 126) is controlled by a shift clock circuit 130 that generates a SHFTCLK signal. In response to the SHFTCLK signal, the write circuit 124 couples data from an I/O bus 132 to the shared data bus 128, or the read circuit 126 couples data from the shared data bus 128 to the I/O bus 132. Data is placed on the I/O bus 132 at a number of data I/Os 134.

The architecture of the RAM 100 in FIG. 1 is referred to as a "pre-fetch" architecture. A pre-fetch architecture is one in which multiple data bit sets are read from an array at one time, and can be sequentially output, one set after the other. For example, in an eight bit pre-fetch architecture, for each data output, eight bits are read from a memory bank, and will be available to be output. In other words, in case of FIG. 1 (which includes an 8 bit pre-fetch), the read operation will initially retrieve 128 bits of data. This data can then be output in eight sets of 16 bits. Pre-fetch architectures can be particularly advantageous for "burst" mode RAMs. In a burst mode RAM a sequence of addresses are accessed by the application of single address. By utilizing a pre-fetch architecture, all bits required for the burst sequence are available with one read operation, obviating the need to address a memory bank a multiple number of times.

Because the RAM 100 of FIG. 1 is a pre-fetch architecture, the shared data bus 128 is larger than I/O bus 132 by a multiple equivalent to the size of the pre-fetch. For example, if the I/O bus 132 was 16 bits wide, and the RAM 100 allowed for an eight bit pre-fetch, the shared data bus 128 would be 128 bits wide. In addition, there would be an eight bit latch circuit associated with data I/O to store the eight pre-fetched bits. Data would be sequentially output from the latches in response to a number of SHFTCLK signals.

Pre-fetch architecture can also be used in increase the speed and efficiency with which data is written into a memory bank. For example, each data I/O could include eight data input latches. In a write operation, for each data I/O, eight data bits could then be sequentially entered. Once all of the data input latches contain data, a single internal write function can simultaneously write all latched data bits. For example, in the RAM 100 of FIG. 1, the write circuit 124 could include 128 latches. Eight sets of 16 bits could be sequentially entered into the latches, and then written along the 128 shared data lines into memory banks.

An example of a write operation for one variation of the RAM 100 is illustrated in FIG. 2. FIG. 2 illustrates a conventional "non-posted" write operation followed by a read operation. The term non-posted is used to distinguish the write operation from a "posted" write, which will described in more detail below. FIG. 2 includes the clock signal CLK, a column address strobe signal CAS_, a write signal W_, a bank select indication BANK SEL, and a description of the type of data on the data I/Os (DATA).

Referring now to FIG. 1 in conjunction with FIG. 2, it is noted that the CAS_ and W_ signals are received at the command decoder 120 on the command bus 122. It is further noted that the example of FIG. 2 illustrates a case of a four bit pre-fetch (as opposed to an eight bit pre-fetch) in order to not generate overly large illustration. That is, in the case of the write operation, on each data I/O, a different data bit will be entered on four successive clock cycles, after which, all four bits will be written in parallel to a memory bank. Similarly, in the case of the read operation, four data bits will be read in parallel for each I/O, and then sequentially output, one by one, on successive clock cycles. It is understood that an eight bit pre-fetch architecture could include eight clock cycles to enter data and read data.

It is also important to note that all the data read by a pre-fetch operation does not have to be provided. If only one set of the pre-fetched data bits is to be read, the SHFTCLK signals will couple the appropriate set of bits from the multiple sets of bits provided by the pre-fetch. This same aspect of pre-fetch functions also applies to write operations.

At time t0, the CAS_ signal goes low on the rising edge of a CLK signal, initiating the beginning of a memory bank column access operation. It is understood that prior to time t0, a row address strobe signal RAS_ (also received on the command bus 122) will have previously transitioned low, resulting in the row buffer 108 receiving a row address on multiplexed bus 118. In response to the row address, row address information is provided to the row decoders 104*a*–104*n*). The row decoders 104*a*–104*n*), in turn, will select a row within at least one of the memory banks (102*a*–102*n*).

Also at time t0, the W_ signal will go low, indicating that the column access operation is a write operation. At the start of the write operation, the STORE signal will be activated, and a column address on the multiplexed bus 118 will be latched within the address latch 116. Following the start of the write operation, the system in which the RAM 100 is operating will provide input data at each I/O on the four successive clock cycles following time t0.

At time t1, the last of the input data is provided at the data I/Os 134. At this point, the "internal" write function takes place. That is, while the input data may be stored in latches on the periphery of the RAM 100, the data still needs to be written into at least one of the memory banks (102*a*–102*n*). Thus, at time t1, the WRITE signal will be activated. With the WRITE signal active, the latched column address from the address latch 116 is coupled to the column decoders (106*a*–106*n*), which will provide a path between the shared data bus 128 and one of the memory banks (102*a*–102*n*). In the particular example of FIG. 2, bank 0 102*a* receives the input data.

The non-posted write operation in FIG. 2 is immediately followed by a read operation. However, because the shared data bus 128 is needed to write latched data from the write circuit 124 to memory bank 0 102*a*, the read operation may not occur while the internal write unction occurs. Thus, in order for a read operation to take place, the shared data bus 128 must be cleared of the input data being written into a memory bank, so that output data may flow from the memory banks (102*a*–102*n*) to the read circuit 126.

At time t2, data have been successfully written into memory bank 0 102*a*, and the subsequent read operation is initiated by the CAS_ signal transitioning low. At the same time, a second column address is provided on the multiplexed address bus 118. In the particular example of FIG. 2, the second column address accesses memory bank 1 102*b*. Because the W_ signal is high at time t2, the CAS_ signal results in a read operation. At the start of the read operation, the READ signal issued by the command decoder 120 goes high, and the column address from multiplexed address bus 118 (as opposed to the latched address stored within address latch 116) is coupled to the column decoders (106*a*–106*n*) by column buffer 112. There is some delay (referred to as "latency") between the initiation of the read operation, and the actual appearance of data at the data I/Os 134. Thus, the data accessed by the read operation started at time t2, will begin to appear at the data I/Os 134 at time t3.

At time t4, the internal read operation is completed. At time t5, the last of the pre-fetched data bits are output at the data I/Os.

It is noted that in the non-posted write/read combination of FIG. 1, between times t0 and t1, the system bus is active as input data bits are being provided to the RAM 100. Along these same lines, the system bus is also active between times t3 and t5, as output data bits are being provided by the RAM 100. However, the system bus is idle between times t1 and t2, as it must wait for the RAM 100 to execute the internal write function before starting the following read operation. This introduces a timing "gap" between the back-to-back non-posted write/read combination, reducing the bandwidth of the RAM 100.

Referring now to FIG. 3, a second type of write/read operation is illustrated. FIG. 3 illustrates a "posted" write operation followed by a read operation. A posted write operation receives and stores input data, and rather than immediately writing the data to memory banks, allows for the internal write function to be executed at a later, more convenient time. FIG. 3 includes the same signals as FIG. 2, the CLK signal, the CAS_ signal, the W_ signal, the BANK SEL indication, and the response of the data I/Os (DATA). FIG. 3 also illustrates a four bit pre-fetch operation.

Referring now to FIG. 3 in conjunction with FIG. 1, between times t0 and t1, the posted write operation takes place in the same manner as the non-posted write operation described in conjunction with FIG. 2. A column address is stored in the address latch 116 by an active STORE signal.

The posted write operation of FIG. 3 deviates from the non-posted example of FIG. 2 in that the internal write function does not occur at time t1. Instead, the RAM 100 is available for immediately executing the subsequent read operation. Thus, at time t1, the WRITE signal is not active, and the internal write function does not take place. Further, with the input data now stored in latches located within the write circuit 124, the shared data bus 128 is free, and the CAS_ signal transitions low to immediately initiate the read operation. As in the case of FIG. 2, in the read operation, a second column address is coupled to the column decoders (106a–106n) by column buffer 112, and due to latency, the output data begins to appear on the data I/Os at time t2.

At time t3, the internal read operation is completed. At time t4, the last of the pre-fetched data bits are output at the data I/Os.

At time t4, it is assumed that the system bus is not active. Absent any further command bus 122 activity, the WRITE signal goes active, initiating the internal write function. The address stored within the address latch 116 is coupled to the column decoders (106a–106n), and the input data stored within the write circuit 124 is coupled to the appropriate memory bank (102a–102n). The internal write function is complete at time t5.

It is noted that the posted write/read combination illustrated by FIG. 3, results in the possibility of "gapless" read operations following a write operation. That is, by utilizing a posted write, the timing gap required for the internal write operation in non-posted writes (shown between times t1 and t2 in FIG. 2) can be eliminated. This increases the bandwidth of the RAM 100 over that of the non-posted write case of FIG. 2. Of course, the internal write function itself is not eliminated, but simply postponed to a more advantageous time. Thus, it must be kept in mind that in the posted write/read case of FIG. 3, some time subsequent to the read operation (shown as time t4–t5 in FIG. 3) must be provided to complete the write operation.

Despite the advantages provided by the posted write/read operations described above, the overall desire to allow computing devices to operate at as fast a speed as possible continues to be a primary motivating factor in the design of computing system components. Accordingly, any further increase in RAM bandwidth, above and beyond the examples set forth above, would further advance the art toward this important goal.

SUMMARY OF THE INVENTION

According to the preferred embodiment, a random access memory (RAM) includes a plurality of memory banks. Data within each memory bank is coupled to an associated local read/write circuit by a shared local input/output (I/O) bus. The shared local I/O bus is coupled to a global bus that is separated into global read bus and a global write bus. The read/write circuits include input data latches for storing data provided on the global write bus.

When a write operation to one memory bank is followed by a read operation to another memory bank, the local read/write circuits enable the internal write function to take place along the global write bus, at the same time data is being read from the global read bus. This capability increases the bandwidth of the RAM, as most write-followed-by-read operations, are not only gapless, but do not require a later period of idle system bus time to complete the posted write operation.

According to another aspect of the preferred embodiment, when a write operation is followed by a read operation to the same memory address in the same memory bank, the write function and read operation can be performed simultaneously by the associated local read/write circuit.

According to another aspect of the preferred embodiment, the RAM is a synchronous RAM.

According to another aspect of the preferred embodiment, the RAM has a pre-fetch architecture.

According to another aspect of the preferred embodiment, the RAM is a dynamic RAM, and includes a multiplexed address bus.

BRIEF DESCRIPTION OF THE DRAWINGS

FIG. 10 is a schematic diagram illustrating a shift register clock circuit that may be employed in the preferred embodiment.

FIG. 11 is a schematic diagram illustrating a multiplexer circuit that may be employed in the preferred embodiment.

FIG. 12 is a schematic diagram illustrating an input/output driver that may be employed in the preferred embodiment.

DETAILED DESCRIPTION OF THE EMBODIMENTS

The preferred embodiment is a synchronous dynamic random access memory (DRAM) that stores and retrieves data in response to an applied address and a variety of control signals. The DRAM is a "by sixteen" configuration, and so provides for read or write operation of 16 bits in parallel. Further, the DRAM has an eight bit pre-fetch architecture, thus, for each memory access, eight bits are accessed in parallel for each data input output (I/O).

Figure 4:
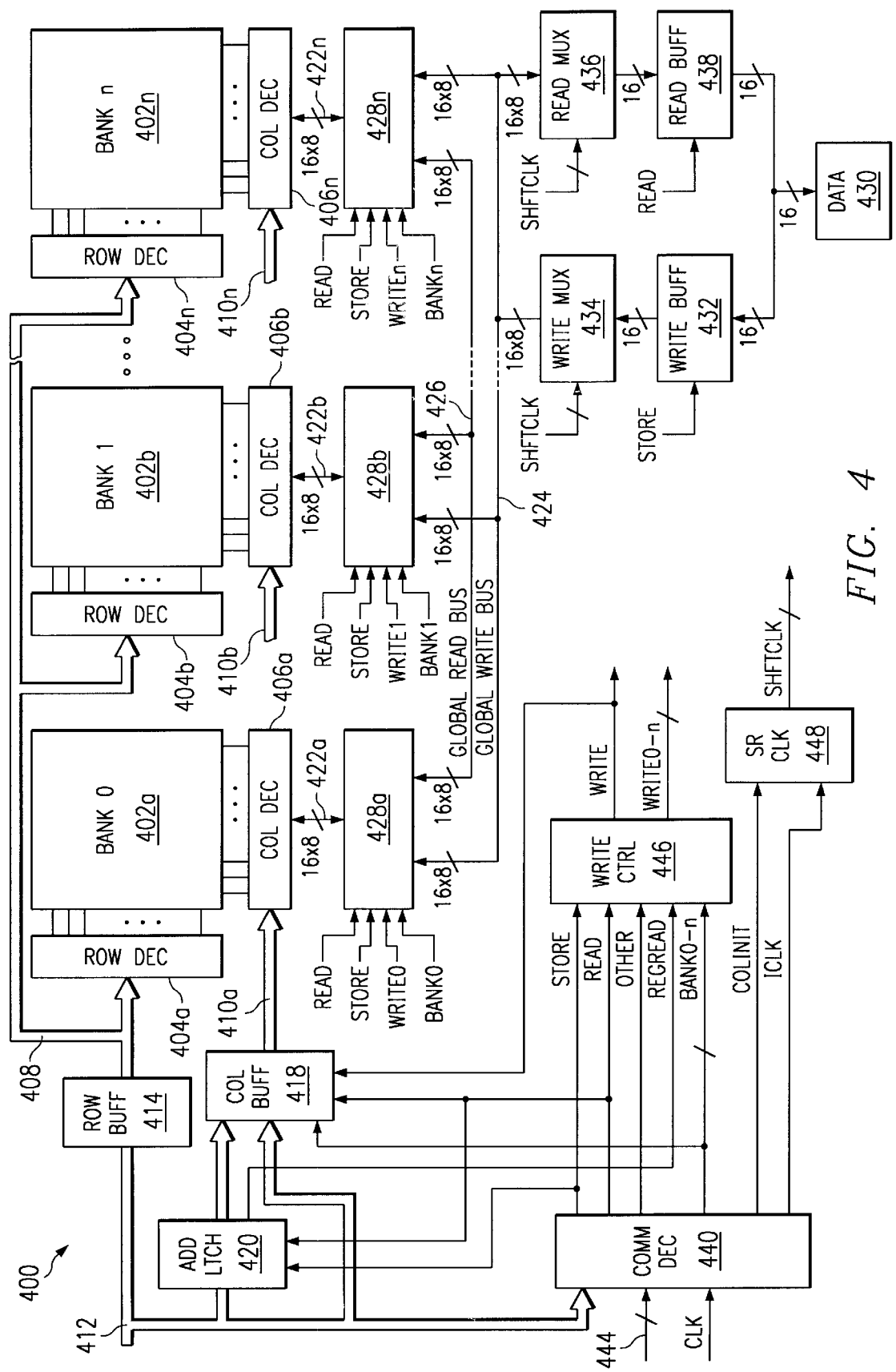
FIG. 4 is a block schematic diagram of a preferred embodiment.

Referring now to FIG. 4, the preferred embodiment is set forth in FIG. 4, and designated by the general reference character 400. The preferred embodiment 400 includes a number of memory banks (402a–402n), each of which includes two memory cell arrays (not shown). The memory cells within the arrays are accessed by corresponding row decoders (404a–404n) and column decoders (406a–406n). It is understood that while the row decoders (404a–404n) and column decoders (406a–406n) are each represented in FIG. 4 by a single block, each decoder could include two or more decoder circuits disposed at different physical locations on the DRAM 400.

Address information for the row decoders (404a–404n) is provided by a row address bus 408, and to the column decoders (406a–406n) by column address buses (410a–410n). In the preferred embodiment 400, address information derived from an external address bus (not shown) is received on a multiplexed address bus 412. The row address information is coupled from the multiplexed address bus 412 to the row address bus 408 by a row address buffer 414. Column address information is provided to the column address buses (410a–410n) by a column address buffer 418. The column address information can originate from the multiplexed address bus 412 or an address latch 420. The address latch 420 is coupled to the multiplexed address bus 412, and in response to a STORE signal, can latch the address information from the multiplexed address bus 412.

The address latch 420 further includes comparator circuits that compare the latched address with a current address on the multiplexed address bus 412. In the event the two addresses are the same, the address latch 420 activates a regular read signal REGREAD.

The column decoders (406a–406n) of each memory bank (402a–402n) have an associated local I/O bus (422a–422n). Each of the local I/O buses (422a–422n) are shared, providing a data input path into the associated column decoder (406a–406n), and a data output path from the associated column decoder (406a–406n).

While the preferred embodiment 400 implements shared I/O buses (422a–422n) that are local to each memory bank (402a–402n), the preferred embodiment 400 further includes a global I/O bus that is shared by the memory banks (402a–402n). Further, the preferred embodiment 400 global I/O bus is not shared, but instead includes a separate global write bus 424 and a separate global read bus 426. The sizes of the global write bus 424 and global read bus 426 are equivalent to the size of the local I/O buses (422a–422n). Because the preferred embodiment 400 has a pre-fetch architecture, the size of the global and local I/O buses is equivalent to the size of the DRAM I/O multiplied by the number of pre-fetch bits (i.e., 16×8).

The preferred embodiment 400 further includes a local read/write circuit (428a–428n) coupled to each column decoder (406a–406n) by the associated shared local I/O bus (422a–422n). The local read/write circuits (428a–428n) serve a number of functions. First, in a write function, each local read/write circuit (428a–428n) couples data on the global write bus 424 to its associated local I/O bus (422a–422n). Second, in a read function, each local read/write circuit (428a–428n) couples data on its associated local I/O bus (422a–422n) to the global read us 426. Third, each local read/write circuit (428a–428n) is capable of latching data present on the global write bus 424.

Data is placed on the global write bus 424 from data I/Os 430 by a write buffer 432 and a write multiplexer (MUX) 434. In a similar fashion, data on the global read bus 426 is coupled to the data I/Os 430 by a read MUX 436 and a read buffer 438.

Referring again to FIG. 4, it is shown that various timing and control signals for the DRAM 400 are generated by a command decoder 440. The command decoder 440 receives address information on the multiplexed address bus 412, command information on a command bus 444, and a synchronous clock signal CLK. The command bus 444 may include a row address strobe signal RAS__, a column address strobe signal CAS__, and a write signal W__. In response to the various inputs, the command decoder 440 provides a STORE signal, a READ signal, an OTHER signal, and a number of bank active signals (BANK0–n).

The STORE signal is active at the start of a write operation. The READ signal is active at the start of a read operation. The OTHER signal indicates the preferred embodiment 400 is executing a function other than a read or write, that does not involve accessing the memory banks (402a–402n). The BANK0–n signals indicate when a particular memory bank (402a–402n) is being accessed by a read or write operation.

The command decoder 440 also generates a COLINIT signal and an ICLK signal. The COLINIT signal is active at the start of a column access. Thus, at the start of a pre-fetch access, the COLINIT signal will be active. The ICLK signal is generally synchronous with the externally applied system clock CLK.

Signals for controlling write operations in the preferred embodiment 400 are generated by a write control circuit 446. The write control circuit 446 receives the STORE signal, the READ signal, the OTHER signal, and the BANK0–n signals from the command decoder 440. In addition, the write control circuit 446 also receives the REGREAD signal from the address latch 420. In response to the various input signals, the write control circuit 446 generates a write function signal, WRITE, and a number of bank write signals (shown as WRITE0–n). Each bank write signal (WRITE0–n) corresponds to one of the memory bank (402a–402n) and its associated read/write circuit (428a–428n).

In the particular embodiment of FIG. 4, the COLINIT signal and ICLK signals are received by a shift register clock circuit 448, which generates a collection of SHFTCLK signals. The SHFTCLK signals provides a clock signal corresponding to each bit of a pre-fetch. Each of the SHFTCLK clock signals is active on a different clock cycle, to enable pre-fetched output data bits to be clocked out of the preferred embodiment 400 in a read operation, or enable input data bits to be clocked into the preferred embodiment 400 for a write function.

Figure 5:
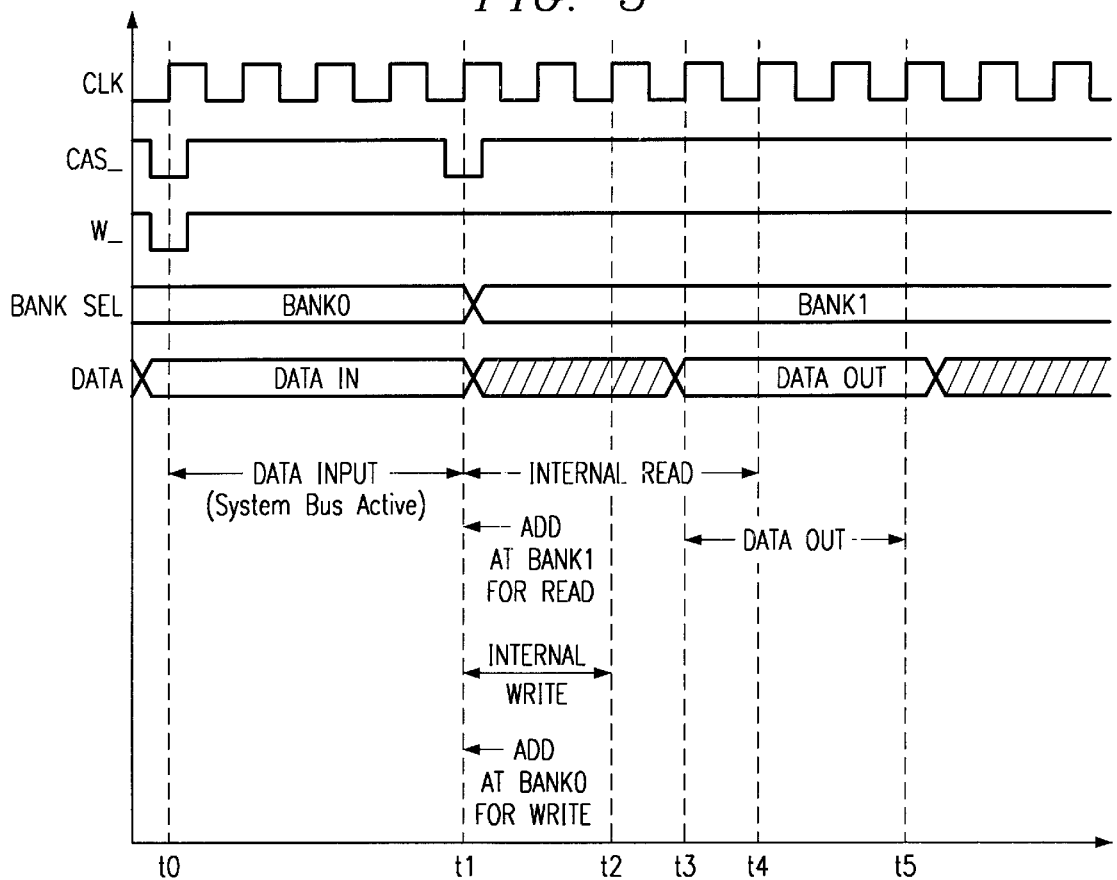
FIG. 5 is a timing diagram illustrating a gapless posted write/read operation of the preferred embodiment.

Referring now to FIG. 5 in conjunction with FIG. 4, an example of a write operation followed by a read operation is set forth in a timing diagram. The operation utilizes a posted write operation according to the preferred embodiment 400. Depending upon the particular memory locations addressed, the preferred embodiment 400 can execute the back-to-back write and read operation, with the internal write function (the writing of data into a memory bank) taking place at the same time as the read operation.

FIG. 5 illustrates the clock signal CLK, a column address strobe signal CAS__, a write signal W__, a bank activation indication BANK SEL, and a description of the type of data at the data I/Os 430 (DATA). While the preferred embodiment 400 sets forth an eight bit pre-fetch architecture, the example of FIG. 5 illustrates a case in which four bits of data (as opposed to eight) are sequentially input in a write operation, and four bits of data (as opposed to eight) are sequentially output in a read operation.

Initially a row address is applied on multiplexed address bus 412 and received by the row address buffer 414. The row address buffer 414 applies row select information on the row address bus 408. In the event a memory bank is activated, one or more word lines within the memory bank will be driven high, and data will be coupled to bit lines within the memory bank. In the example of FIG. 5 it is assumed that the first memory bank 402a is activated prior to time t0. Accordingly, the BANK0 signal will be high.

At time t0, a column access operation is initiated by the CAS__ signal transitioning low. At the same time, the W__ signal is also low, indicating that the column access operation is a write operation. Also at this time, the address on the multiplexed address bus 412 switches from a row address to a column address. Because the operation is a write operation, the STORE signal goes high. With the STORE signal high, the column address is latched in the address latch 420. The high STORE signal also enables the write buffer 432, and input storage latches within the local read/write circuits (428a–428n). Which of the local read/write circuits (428a–428n) latches data depends upon whether or not the associated band (402a–402n) is activated. In the example of FIG. 5, the write operation is into the first bank 402a, and so the BANK0 signal is high, and the latches within the local read/write circuit 428a are enabled.

Between times t0 and t1, a sequence of input data bit sets are presented at the data I/Os 430 in synchronism with the CLK signal. The write buffer 432 (enabled by the high STORE signal) buffers the sequence of input data bits, and each set is coupled to the global write bus 424 by the write MUX 434. As the input data bits are driven on the global write bus 424, the data latches within the local read/write circuit 428a, latch the input data.

At time t1, the last of the input data is latched within the read/write circuit 428a associated with memory bank 402a. At this same time, the CAS_ signal transitions low a second time. During this second transition, the W_ signal is high, indicating the column access operation is a read operation. In the example of FIG. 5, the read operation is directed at memory bank 402b, which is a different memory bank than the previous write operation. Thus, the BANK1 signal will be active and the BANK0 signal will be inactive. The second low CAS_ transition is accompanied by a new column address on the multiplexed address bus 412.

The read operation results in the READ signal going high. The high READ signal allows the column address on the multiplexed address bus 412 to flow through the column buffer 418 to the column decoders (406a–406n). The high READ signal also causes the address latch 420 to compare the previously latched address (where the write operation is to take place) with the current address on the multiplexed address bus 412 (where the read operation is take place). In the event this comparison indicates that the read and write addresses are the same, the REGREAD signal will be active.

The active READ signal further activates the local read/write circuit (428a–428n) of the bank from which the read operation is taking place. As noted above, in the example of FIG. 5, the read operation takes place at memory bank 402b. Consequently, a read path between the shared local I/O bus 422b and the global read bus 426 will be enabled by local read/write circuit 428b. This results in pre-fetched data being placed on the global read bus 426 from column decoder 406b. Finally, the active READ signal enables the read buffer 438, allowing data signals from the read MUX 436 to be driven at the data I/Os 430.

In a similar fashion to the write MUX 434, the read MUX 436 is responsive to the SHFTCLK signals, and couples the parallel sets of pre-fetched output data, on successive clock cycles to the read buffer 438. Thus, at time t1, output data is being read from memory bank 402b, and after latency period, the output data begins appearing at the data I/Os 430 at time t3. All the data is output from memory bank 402b by time t5.

Unlike the prior art posted read/write operations described above, in the preferred embodiment 400, at the same time read data begins to be read out from one memory bank via the global read bus, the data that was previously latched in the write operation, can be written from a local read/write circuit into another memory bank. In the particular example of FIG. 5, it is shown that at time t1, as the column address for the read operation is applied to the column decoder 406b (i.e. to BANK 1 402b), the write address previously stored in the address latch 420 (i.e., to BANK 0 402a), is applied to the column decoder 406a. At the same time, the input data previously latched within local read/write circuit 428a is written into memory bank 402a (BANK 1).

The simultaneous write function is accomplished by the WRITE signal being high at time t1. The high WRITE signal couples the address stored within the address latch 420 to column decoder 406a, enabling a path between the shared local I/O line 422a and the memory bank 402a. At the same time, the write control circuit 446 activates the WRITE0 signal, enabling the write function within the local read/write circuit 428a.

In this manner, the preferred embodiment 400 can provide for a gapless posted write/read operation, that does not require some later idle bus time for the internal write function to take place. This advantageously increases the bandwidth of the DRAM above and beyond prior art approaches.

It is noted, that in order for the advantageous simultaneous write function and read operation to occur, the operation must be a "different bank" write-followed-by-read operation. The operation is referred to as a "different bank" operation, as the write operation is to one memory bank, while the read operation is to a different memory bank. This arises because each of the column decoders (406a–406b) of the preferred embodiment 400, cannot access more than one address in its respective memory bank (402a–402n) at the same time.

Figure 3:
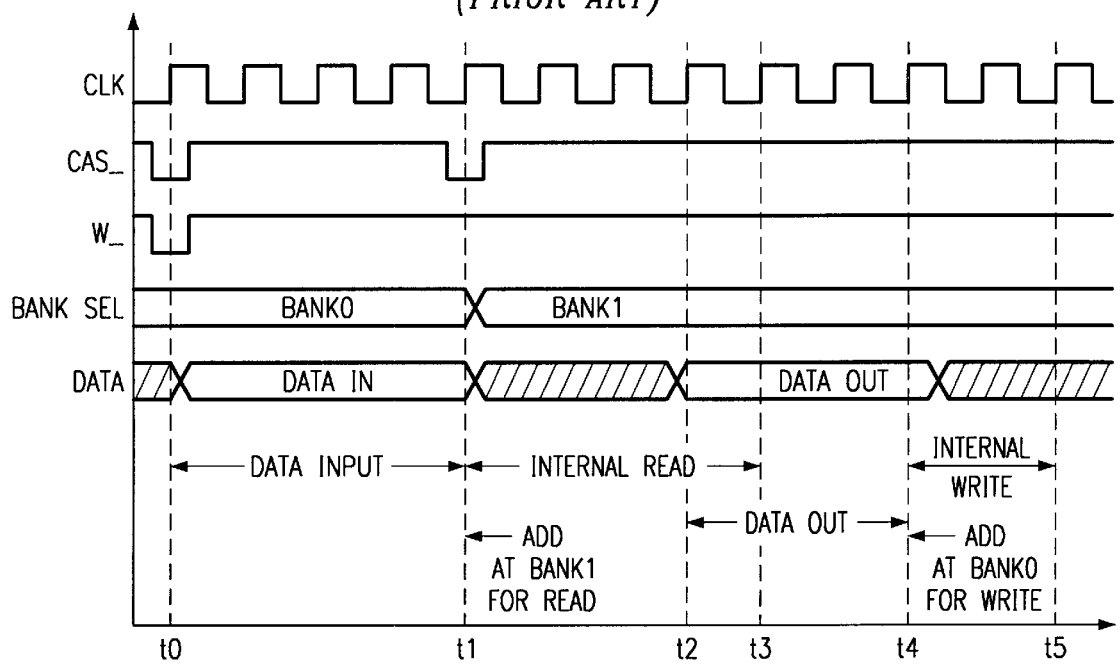
FIG. 3 is a timing diagram illustrating a "gapless" posted write/read operation in the RAM of FIG. 1.

In contrast, in a "same bank" write-followed-by-read operation, the preferred embodiment 400 will not perform an internal write operation during the read operation. Thus, for the same bank case, the preferred embodiment 400 will function generally as set forth in FIG. 3. At the start of the write operation, the input data will be latched in a local read/write circuit. At the start of the read operation, while the input data is stored in the local read/write circuit latches, read data will be output through the same local read/write circuit. Once the read operation is completed, the same local read/write circuit will then write data into the memory bank.

There is an exception to the "same bank" case, however. The exception would be a "same bank same address" case, in which the write operation and read operation are to the same address within the same memory bank. For this situation, the preferred embodiment 400 will respond as illustrated in FIG. 5 (i.e., in the same fashion as a "different bank" write-followed-by-read operation). At the start of the write operation, the input data will be latched in a local read/write circuit. At the start of the read operation, the latched data is written not only into the associated memory bank, but also onto the global read bus. Thus, in the "same bank same address" case, the latched input data is essentially simultaneously "written" to the memory bank and to the data I/Os 430.

Figure 6:
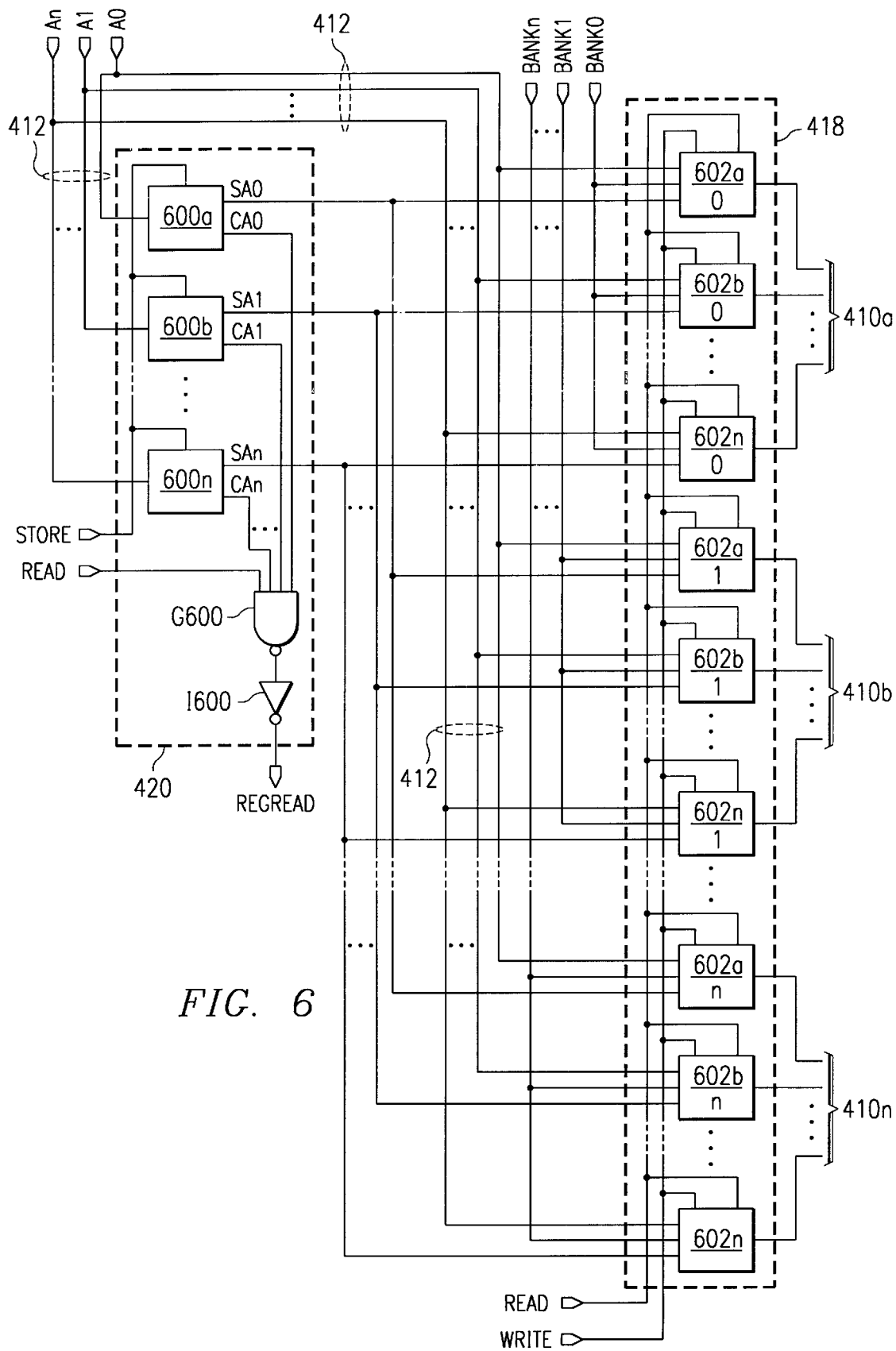
FIG. 6 is a schematic diagram illustrating an address latch and a column buffer that may be employed in the preferred embodiment.

Referring now to FIG. 6, a block schematic diagram is set forth illustrating an address latch 420 and column address buffer 418 that may be used in the preferred embodiment 400. FIG. 6 sets forth the address bus 412, which is shown to include a number of address lines A0–An. The address latch 420 is shown to include a bit latch/comparator (600a–600n) corresponding to each address line A0–An. Each latch/comparator (600a–600n) receives the STORE signal and one of the address lines (A0–An), and provides a stored address bit (SA0–SAn), and a comparison signal (CA0–CAn). The comparator signals are logically NANDed with the READ signal in a NAND gate G600. The output of gate G600 is inverted by inverter I600 to generate the REGREAD signal.

The column address buffer 418 is shown to include a number address bit buffers (602a–602n). Each bit buffer (602a–602n) receives an address line (A0–An), one of the stored address signals (SA0–SAn) from the address latch 420, the READ signal, and the WRITE signal. The bit buffers (602a–602n) couple address signals from the address bus 412, or stored address signals (SA0–SAn) from the address latch 420 to one of the various column address buses (410a–410n), according to a high bank active signal (BANK0–n). Thus, the bit buffers (602a–602n) are divided into groups, with each group being coupled to a different bank active signal (BANK0–n). In the particular example of FIG. 6, the bit buffers (602a0–602n0) controlled by the signal BANK0, couple address signals to the column address bus 410a. Those bit buffers (602a1–602n1) controlled by the signal BANK1, couple address signals to the column address bus 410b, and those bit the bit buffers (602an–602nn) controlled by the signal BANKn, couple address signals to the column address bus 410n.

Whether the stored column address (SA0–SAn) or the current column address (A0–An) is coupled to a column address bus (410a–410n) is determined by the READ and WRITE signal. In the event the READ signal is active, the current address on the multiplexed address bus 412 is coupled to one of the column address buses (410a–410n). In the event the WRITE signal is active, the stored address (SA0–SAn) is coupled to one of the column address buses (410a–410n).

Figure 7:
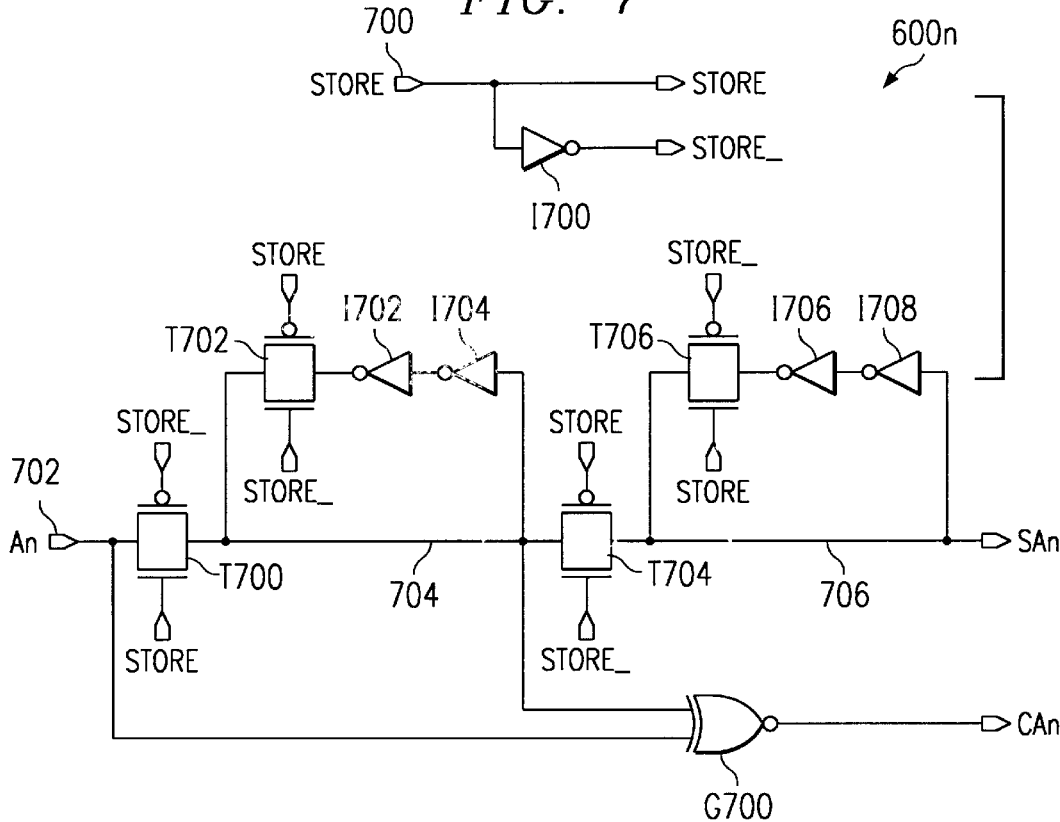
FIG. 7 is a schematic diagram illustrating an address latch/comparator that may be employed in the preferred embodiment.

Referring now to FIG. 7, a schematic diagram is set forth, illustrating a bit latch/comparator 600n that may be used in the preferred embodiment 400. It is understood that while reference character 600n is used for the bit latch/comparator, this reference character is intended to represent any of the bit latch/comparators set forth in FIG. 6. Thus, the use of the letter "n" at the end of reference characters in FIG. 7, is intended to represent any of the letters in the range "a"–"n". The bit latch comparator 600n includes a store signal input node 700 that receives the STORE signal. The STORE signal is inverted by an inverter I700 to generate a STORE_ signal. The STORE signal and its inverse (STORE_) are used to latch address signals in the bit latch/comparator 600n. An address input 702 receives an address signal An, and is coupled to an input latch node 704 by a transfer gate T700. The logic value at the input latch node 704 is latched by a pair of inverters I702 and I704 arranged in series with a transfer gate T702. The input latch node 704 is coupled to an output latch node 706 by another transfer gate T704. In the same manner as the input latch node 704, the logic at the output latch node 706 is latched by the series connection of a transfer gate T706, and two inverters I706 and I708. The output latch node 706 provides the stored address bit SAn.

The bit latch/comparator 600n further includes a two-input exclusive NOR gate G700. One input of gate G700 is coupled to the address input 702. The other input is coupled to the input latch node 704. The output of gate G700 is the compare signal CAn. Thus, the exclusive NOR gate G700 serves to compare a current column address bit and latched column address bit, and provide an indication that the current and latched address bits are the same, by providing a high CAn signal as an output.

In operation, address signals are presented at the address input 702. Prior to a write operation, the STORE signal is low, and so transfer gates T700 and T706 are off, and transfer gates T702 and T704 are on. In this state, the address signal is prevented from being latched at the input storage node 704. When a write operation begins, the STORE signal goes high. Transfer gates T700 and T706 are turned on and the address signal at the address input is coupled to the input latch node. Transfer gate T702 is off, preventing the address signal from being latched, and transfer gate T704 is off, preventing the address signal from being coupled to the output latch node 706. When the STORE signal transitions low, transfer gates T700 and T706 are turned off once again, and transfer gates T702 and T704 are on. With transfer gate T702 on, the address signal is latched at the input latch node 704. In addition, with transfer gate T704 on, the latched signal at the input latch node 704 is also provided at the output node 706. In this manner, one address bit can be latched and retained, while another address is present at the address input 702.

Once the STORE signal has gone high and returned low, and a second column address is applied to the multiplexed address bus 412, a current address bit will be present at the address input 702, and a latched address bit will be present at the output latch node 706. In the event the two values are different, gate G700 will provide a low compare bit signal CAn. If, however, the present and stored address bits are the same (which can indicate that an initial write address bit is the same as a subsequent read address bit), the output of gate G700 will provide a high compare bit CAn.

Figure 8:
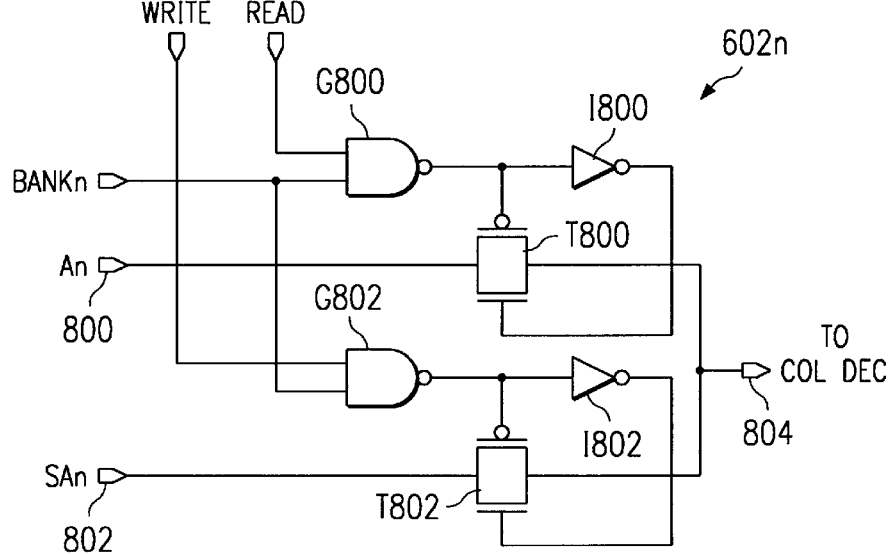
FIG. 8 is a schematic diagram illustrating a bit buffer circuit that may be employed in the preferred embodiment.

Referring now to FIG. 8, a bit buffer 602n that may be used in the preferred embodiment 400 is set forth in a schematic diagram. As in the case of FIG. 7, the use of the character "n" at the end of reference numerals in FIG. 8, is intended to represent any of the designations "a"–"n" set forth in FIG. 6. The bit buffer 602n includes a first path input 800 that is coupled an address bus line to receive a current address bit An. A second path input 802 receives the stored address bit SAn associated with the address line. The first path input 800 is coupled to a bit buffer output 804 by a transfer gate T800. Similarly, the second path input 802 is coupled to the bit buffer output 804 by another transfer gate T802. The transfer gate T800 is enabled by a NAND gate G800 and inverter I800 combination. Gate G800 receives a bank active signal BANKn and the READ signal as inputs. The output of gate G800 is coupled to the p-channel MOS device of transfer gate T800 and the input of inverter I800. The output of inverter I800 drives the n-channel MOS device of transfer gate T800. The other transfer gate T802 is enabled by a similar second NAND gate G802 and inverter combination I802. However, unlike gate G800 which receives the READ signal as an input, gate G802 receives the WRITE signal as an input.

In the event the BANKn signal and the READ signal are high, indicating that a read operation is taking place at the memory bank associated with the bit buffer 602n, transfer gate T800 is enabled, and the current address bit An is provided to a column decoder. In contrast, in the event the BANKn signal is high while the WRITE signal is high, the transfer gate T802 is enabled, and the stored address bit SAn is provided to the column decoder.

Figure 9:
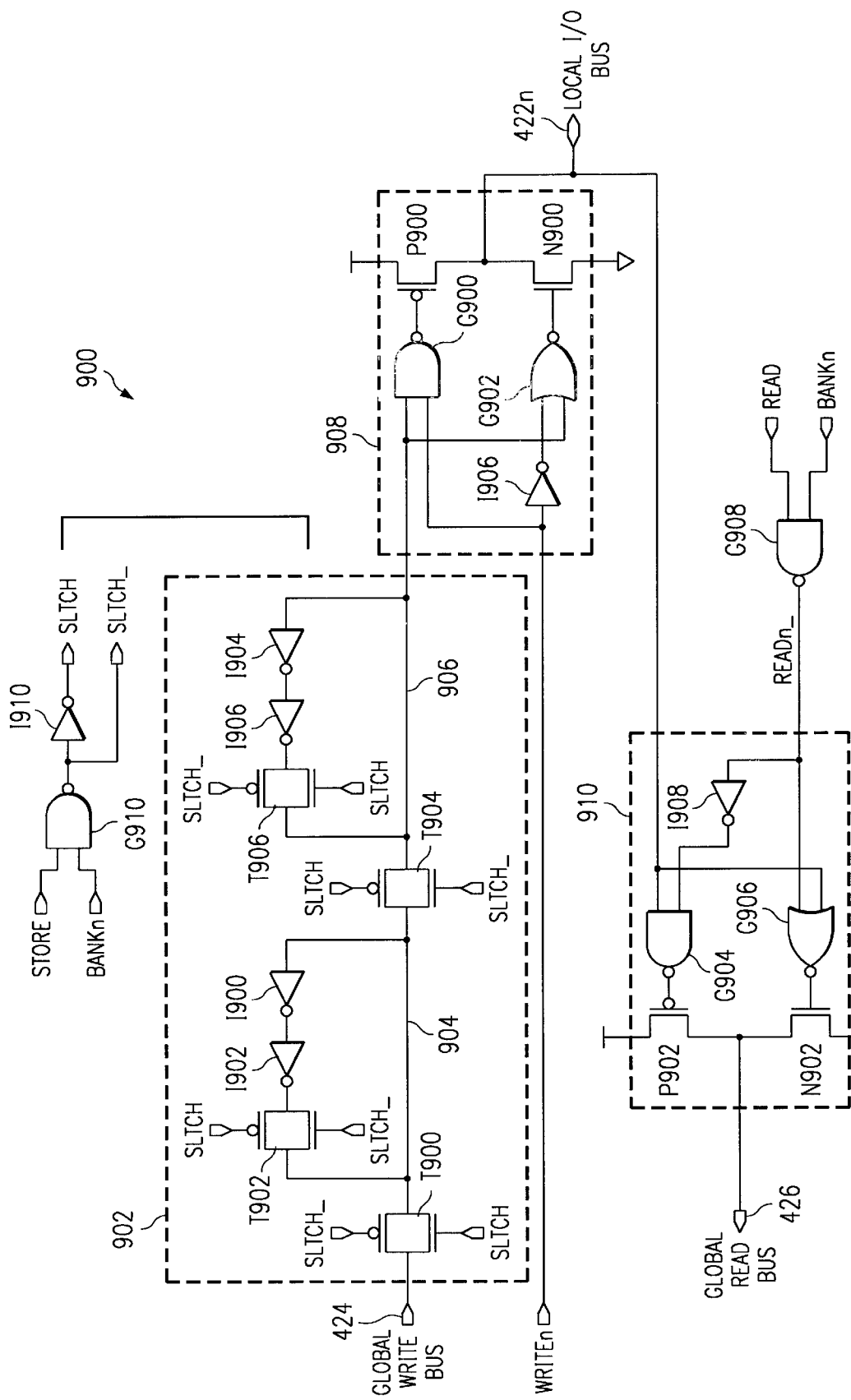
FIG. 9 is a schematic diagram illustrating a read/write circuit that may be employed in the preferred embodiment.

Referring now to FIG. 9, a schematic diagram of a local one bit read/write path is set forth in a schematic diagram, and designated by the general reference character 900. In the same fashion as FIGS. 7 and 8, the use of the character "n" at the end of reference numerals in FIG. 9 is intended to represent any of the designations "a"–"n". Multiples numbers of the read/write paths 900 shown in FIG. 9 may be arranged in parallel to form the local read/write circuits shown as 428a–428n in FIG. 4. For example, in order to couple the 16×8 global read bus 426 and write bus 424 to a shared 16×8 local I/O bus (422a–422n), 128 such read/write paths 900 would be disposed in parallel.

Each read/write path 900 is shown to be coupled to one line of the global write bus 424 and one line of the global read bus 426. The global write bus 424 is coupled to a local write latch 902. The local write latch 902 is shown to include a first latch node 904 that is coupled to the global write bus line 424 by transfer gate T900. A data value is latched at the first latch node 904 by a latching feedback path formed by the series connection of two inverters I900 and I902, and a second transfer gate T902. The first latch node 904 is coupled to a second latch node 906 by a third transfer gate T904. Data is latched at the second latch node 906 by another feedback loop formed by the series connection of another two inverters I904 and I906, and a fourth transfer gate T906.

The data value stored by the second latch node 906 is provided as one input to a local write driver 908. The local write driver 908 is enabled by a bank particular write enable signal, shown as WRITEn. When the WRITEn signal is high, the local write driver 908 is enabled. When the WRITEn signal is low, the local write driver 908 is disabled. In the particular embodiment of FIG. 9, the local write driver 908 is shown to include a two-input NAND gate G900, a two-input NOR gate G902, an inverter I906, a p-channel pull-up MOS transistor P900, and an n-channel pull-down transistor N900. Gate G900 has one input coupled to the second latch node 906 and another input coupled to the WRITEn signal. Gate G902 also includes one input coupled to the second latch node 906. The other input of gate G902 receives the WRITEn signal by way of the inverter I906. Transistors P900 and N900 have source-drain paths arranged in series between a high power supply voltage and a low power supply voltage. The gate of transistor P900 is coupled to the output of gate G900, and the gate of transistor N900 is coupled to the output of gate G902. The common drains of transistors P900 and N900 are coupled to one line of the local I/O bus 422n.

Thus, the particular read/write path 900 of FIG. 9 includes a write path created by a local write latch 902, and a local write driver 908.

A data value on the local I/O bus line 422n is driven on the global read bus 426 by a local read driver 910. The local read driver 910 has the same general configuration as the local write driver 908, and includes a two-input NAND gate G904, a two-input NOR gate G906, an inverter I908, a p-channel pull-up MOS transistor P902, and an n-channel pull-down transistor N902. The local read driver 910 is enabled by a bank particular read signal, shown as READn_. The READn_ signal is generated by a two-input NAND gate G908 which receives the READ signal and one of he BANKn signals as inputs.

Thus, the particular read/write path 900 of FIG. 9 includes a read path created by the local read driver 910.

Also shown in FIG. 9 is the circuit used to generate control signals for activating the transfer gates (T900–T906) within the local write latch 902. The circuit includes a two-input NAND gate G910 in series with an inverter I910. Gate G910 receives the STORE and one of the BANKn signals as inputs. The output of gate G910 provides a SLTCH_ signal, and is also provided as the input to inverter I910. The output of inverter I910 is a SLTCH signal. It is understood that one such NAND gate G910/inverter I910 combination could provide the timing signals for all of the parallel read/write paths 900 within a local read/write circuit 428n.

In a "different bank" write-followed-by-read operation, the read/write path 900 associated with one memory bank will perform a write function, while the read/write path 900 associated with another memory bank will perform a read function. In the case of the write function, at the beginning of a write operation, the STORE signal will pulse high. Provided the appropriate BANKn signal is high, the SLTCH signal will transition high, and a data bit at the global write bus line 424 will be latched at the first and second latch nodes (904 and 906). The WRITEn signal will remain low, disabling the local write driver 908. Once the subsequent read operation begins, the WRITEn signal will go high, enabling the local write driver 908, which couples the data latched in the local write latch 902 to the local I/O bus line 422n.

At the same time, in a read/write path 900 in a different local read/write circuit 428, the READn_ for that read/write circuit 428 will be low, enabling the local read driver 910, and driving the global read bus 426 according to the data values on the local I/O bus line 422n.

It is noted, that in the "same bank same address" case, the WRITEn signal and the READn_ signal of the same read/write path 900 will be active (i.e., WRITEn will be high, and READn_ will be low). Thus, the local write driver 908 and local read driver 910 will both be enabled. The local write driver 908 will drive the local I/O line 422n according to the data value latched by the local write latch 902. The local read driver 910 will drive the global read line 420 according to the output of the local write driver 908.

Finally, it is noted that in the "same bank different address" case, the WRITEn signal will be active after the READn_ signal is inactive. Thus, the local read driver 910 will be enabled at the start of the read operation, and once the read operation is complete, the local write driver 908 will be enabled.

Referring now to FIG. 10, a schematic diagram of a shift register clock circuit that may be used with the preferred embodiment 400 set forth in FIG. 4, and designated by the general reference character 448. The shift register clock circuit 448 receives a COLINIT signal at a start clock input node 1000, and includes a number of shift register stages (1002a–1002p) that shift data in response to ICLK and ICLK_ signals. The ICLK signal can be received from the command decoder 440, and the ICLK_ signal is generated by inverting the ICLK signal with an inverter I1000.

In the particular shift register clock circuit 448 of FIG. 10, each shift register stage (1002a–1002p) includes a clock output node (1004a–1004p) which provides a shift clock signal (SHFT0–SHFTp). The letter "p" in FIG. 10 is equivalent to the number of bits that are pre-fetched in the preferred embodiment 400. The shift clock signals (SHFT0–SHFTp) are delayed with respect to one another by one clock cycle. Therefore, the first shift register stage 1002a will output a SHFT0 clock pulse on one clock cycle. In the next clock cycle, a second shift register stage 1002b (not shown in FIG. 10) will output a SHFT1 clock pulse. This sequential activation of different clock signals continues until the last shift register stage 1002p outputs a final SHFTp clock pulse.

In the shift register clock circuit 448 of FIG. 10, each shift register stage (1002a–1002p) includes the same general elements. Therefore, the elements and operation of the first shift register stage 1002a will be described, it being understood that the remainder of shift register stages (1002b–1002n) function in the same general fashion.

Shift register stage 1002a includes an input transfer gate T1000a that couples the start clock input node 1000 to a first register node 1006a. Data values are latched at the first register node 1006a by a feedback leg formed by the series connection of two inverters I1002a and I1004a, and a transfer gate T1002a. The first register node 1006a is coupled to a second register node 1008a by a transfer gate T1004a. Data values are latched at the second register node 1008a by the series connection of inverters I1006a and I1008a, and transfer gate T1006a.

The logic value at the second register node 1008a is used to generate the clock signal SHFT0 output from of the shift register stage 1002a. The second register node 1008a is provided as one input to a two-input NAND gate G1000a. The other input to gate G1000a is the ICLK signal. The output of gate G1000a is inverted by inverter I1010a to generate the SHFT0 signal.

In operation, at the start of a column access operation (for example, when the column address is applied in a read or write operation) the COLINIT signal will pulse high. With the COLINIT signal high, the ICLK (and ICLK_) signals will generally track the system CLK signal. ICLK will go high, and the high COLINIT logic level will be coupled from the start clock input node 1000 to the first register node 1006a, as transfer gates T1000a and T1006a are turned on, and transfer gates T1002a and T1004a are turned off. The ICLK signal will return low, and transfer gates T1000a and T1006a will turn off, and T1002a and T1004a will turn on. This will latch the high logic level at the first and second register nodes (1006a and 1008a), and isolate the first register node 1006a from the start clock input node 1000.

The COLINIT will then return low for the remainder of the column access operation. The ICLK signal, however, will continue to transition between high and low levels in a periodic manner. Thus, as the ICLK signal goes high on the next clock cycle, high logic at the second register node 1008a will result in the SHFT0 signal pulsing high by operation of gate G1000a and inverter I1010a. At the same time, transfer gate T1000b will turn on, and the high logic level at the second register node 1008a will be coupled to the first register node 1006b of a second shift register stage. In addition, the high ICLK signal will couple the low COLINIT logic level at the clock input node 1000 to the first register node 1006a. When the ICLK signal transitions low once more, the low logic level at the first register node 1006a will be latched in the first register stage 1002a, essentially "clearing" the first register stage 1002a. Simultaneously, the high logic level will be latched in the second register stage. In this manner, the high logic level established by the initial COLINIT pulse is shifted from the first shift register stage 1002a to the second shift register stage. The operation described above continues until the high logic level initially established by the COLINIT signal results in a high SHFTp signal at the last shift register stage 1002p.

Referring now to FIG. 11, a schematic diagram of a multiplexer circuit 1100 is set forth. The multiplexer circuit 1100 may be used as the write MUX 434 or the read MUX 436 in the preferred embodiment 400. The multiplexer circuit 1100 is coupled to a first bus 1102 and a second bus 1104. The first bus 1102 has a bus width of M bits, and the second bus 1104 has a bus width that is some multiple of M. In the particular multiplexer circuit 1100 of FIG. 11, the second bus 1104 has a bus width of M×P, where P is the number of pre-fetched bits. Thus, the second bus 1104 can be considered as being logically divided into P groups of M lines each. The logical groups of second bus lines are shown as (1106a–1106p).

Figure 1:
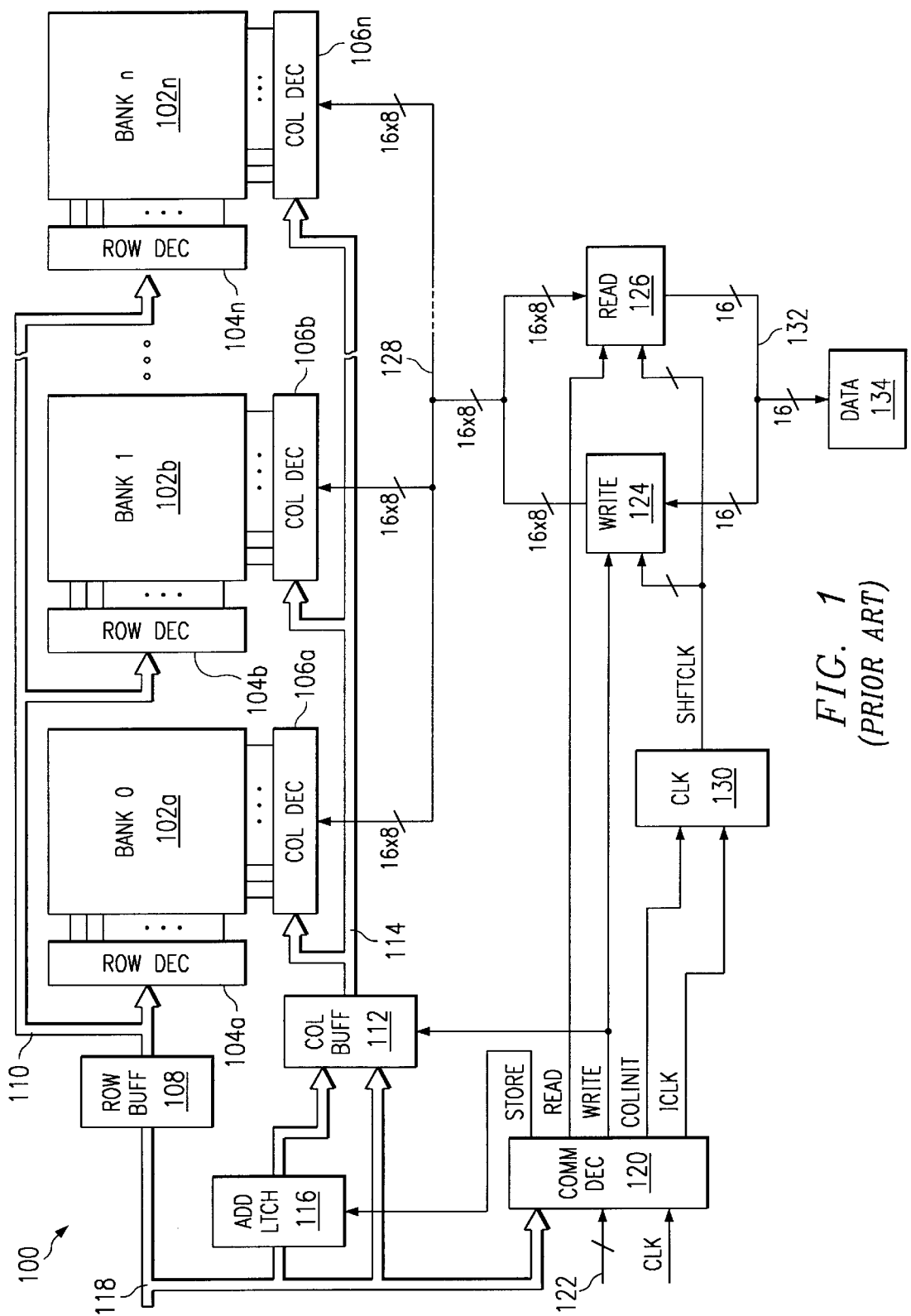
FIG. 1 is a block schematic diagram of a prior art RAM.
Figure 2:
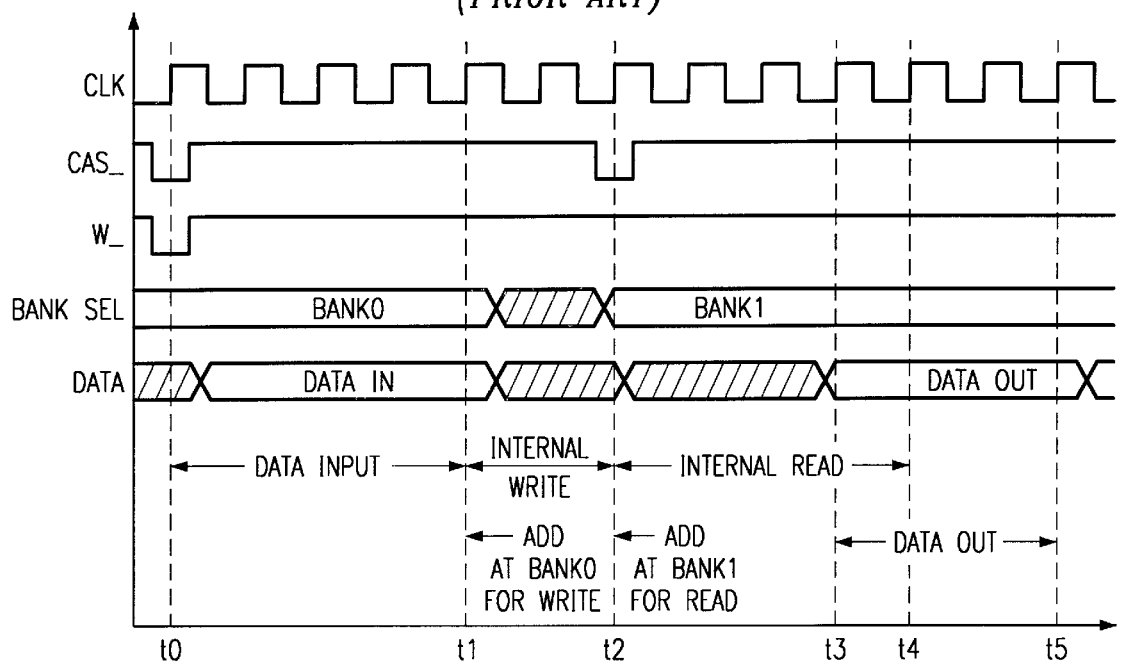
FIG. 2 is a timing diagram illustrating a "non-posted" write/read operation in the RAM FIG. 1.

In operation, the multiplexer circuit 1100 couples the first bus 1102 to a different group of second bus lines (1106a–1106p) in response to a number of steering signals. In the particular example of FIG. 1, the steering signals are the SHFTCLK signals, shown as SHFT0–SHFTp.

The multiplexer circuit 1100 includes a set of transfer gates corresponding to each group of second bus lines (1106a–1106n). Each set of transfer gates is enabled by one of the steering signals (SHFT0–SHFTp). Three groups of transfer gates are illustrated. The first group is enabled by the SHFT0 signal, and includes transfer gates T1100, T1102 and T1104. While three transfer gates are illustrated, it is understood that there are "M" such transfer gates in the group. A second group of transfer gates (also having a total of M gates) is represented by transfer gates T1106, T1108 and T1110. A last group of transfer gates (also having a total of M gates) is represented by transfer gates T1112, T1114 and T1116. It is also understood, that in the particular embodiment of FIG. 11, there are a total of "P" such groups of transfer gates.

When employed as a write multiplexer 434 in the preferred embodiment 400, the first bus 1102 is the 16 bit wide data bus that receives input data from the write buffer 432. The second bus is the 16×8 global write bus 424. In operation, during a write operation, a first set of input data bits is received from the data I/O 430 (by way of the write buffer 432) on the first bus 1102. On a first clock cycle, the SHFT0 signal pulses high, and the first group of transfer gates (T1100–T1104) is enabled, coupling this first set of input data bits to the first group of second bus lines 1106a. On a second clock cycle, a second set of input data bits is presented on the first bus 1102. The SHFT1 signal pulses high, and the second group of transfer gates (T1106–T1110) is enabled, and the second set of input data bits is coupled to the second group of second bus lines 1106b. This continues until a last group of input data bits is coupled to the last group of second bus lines 1106p by transfer gates T1112–T1116 being enabled in response to the SHFTp signal.

When employed as a read multiplexer 436 in the preferred embodiment 400, the first bus 1102 is the 16 bit wide data bus that couples output data to the read buffer 438. The second bus is the 16×8 global read bus 426. In operation, during a read operation, output data on the second bus 1104 is coupled by second bus groups (1106a–1106p) to the first bus 1102. In the preferred embodiment 400, a single pre-fetch operation will provide data on all of the lines of the second bus 1104. On a first clock cycle, the SHFT0 signal pulses high, and the first group of transfer gates (T1100–T1104) is enabled, coupling data on the first group of second bus lines 1106a to first bus 1102. In a similar fashion, the remaining steering signals pulse high to sequentially couple the groups of second bus lines to the first bus 1102.

Referring now to FIG. 12, an I/O buffer circuit 1200 is set forth in a schematic diagram. Multiple such circuits can be arranged in parallel to form the write buffer 432 or read buffer 438 of the preferred embodiment 400. In such a case, one such buffer circuit 1200 would be employed for each data I/O 430. In the particular case of FIG. 4, sixteen such parallel I/O buffer circuits 1200 would be used in both the write buffer 432 and the read buffer 438.

The I/O buffer circuit 1200 is shown to include an input node 1202, a control node 1204, and an output node 1206. A two-input NAND gate G1200 has inputs coupled to the input and control nodes (1202 and 1204), and drives a pull-up p-channel MOS transistor P1200. A two-input NOR gate G1202 has one input coupled directly to the input node 1202, with the other input being coupled to the control node 1204 by way of inverter I1200. The output of gate G1202 drives pull-down n-channel MOS transistor N1200. The source-drain paths of the transistors P1200 and N1200 are arranged in series. The common drains of the transistors P1200 and N1200 provide the output node 1206.

When the I/O buffer circuit 1200 is employed in a write buffer 432 of the preferred embodiment 400, the input node 1202 would be coupled to one of the data I/Os 430. The control node 1204 would receive the WRITE signal, and the output node 1206 would be coupled as an input to the write MUX 434. In contrast, the when employed in a read buffer 438 of the preferred embodiment 400, the I/O buffer circuit 1200 would essentially be reversed in direction. The input node 1202 would be coupled to the read MUX 436, the output node 1206 would be coupled to one of the data I/O 430, and the control node 1204 would receive the READ signal.

Figure 13:
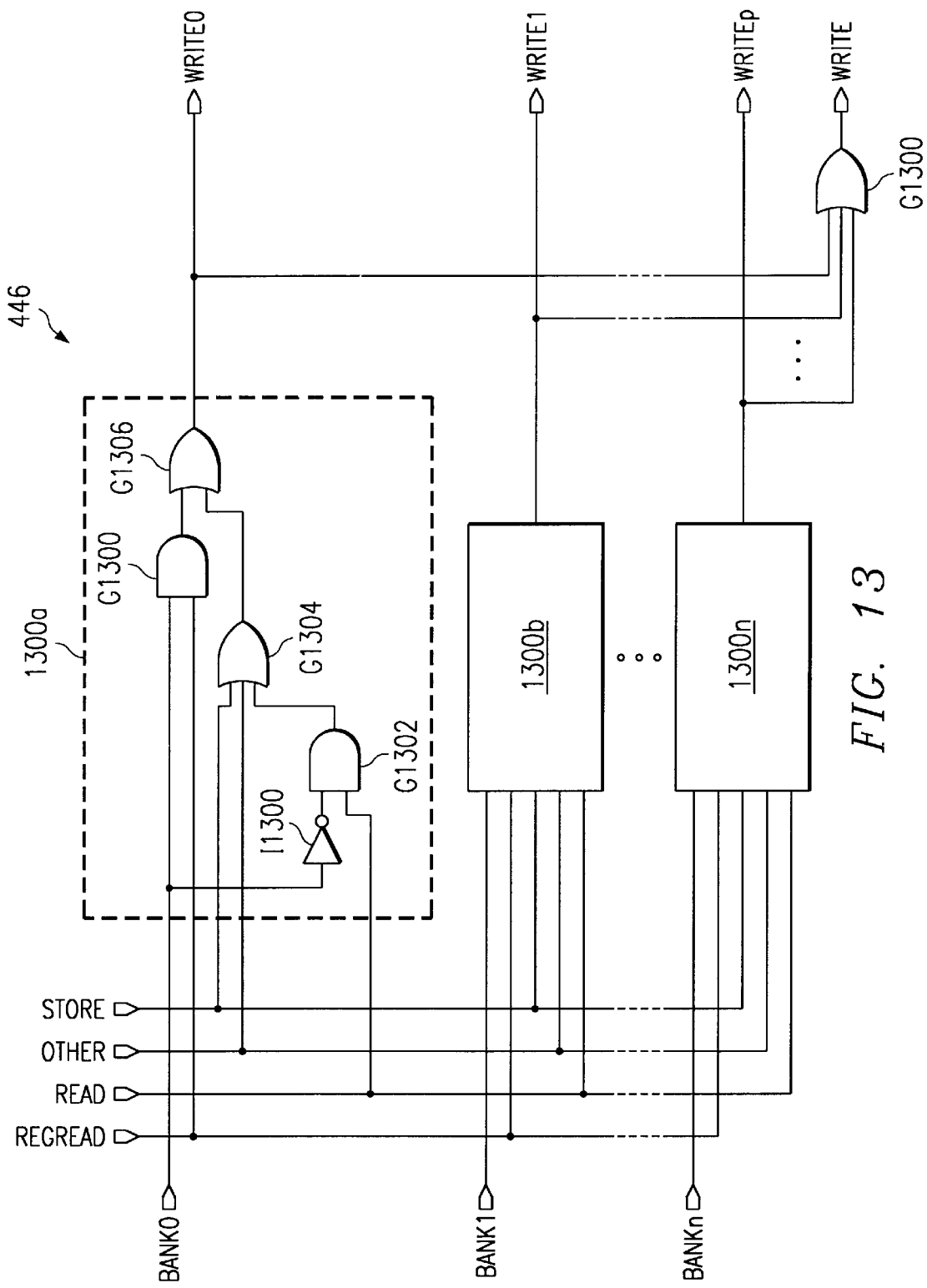
FIG. 13 is a block schematic diagram illustrating a write control circuit that may be employed in the preferred embodiment.

Referring now to FIG. 13, a write control circuit that may be used in the preferred embodiment 400 is set forth in a block schematic diagram, and designated by the general reference character 446. The write control circuit 446 is shown to include a number of bank write circuits, shown as 1300a–1300n. Each bank write circuit (1300a–1300n) receives the same collection of control signals, which includes the REGREAD signal, the READ signal, the OTHER signal, and the STORE signal. In addition, each bank write circuit (1300a–1300n) also receives one of the bank active signals (BANK0–n). In response to the various input signals, each bank write circuit (1300a–1300n) will provide a bank write enable signal, shown as WRITE0–n. In addition, the bank write enable signals WRITE0–n are logically ORed together in an OR gate G1300 to generate the WRITE signal.

In the particular write enable circuit 446 of FIG. 13, each bank write circuit (1300a–1300n) includes the same general circuit structures, and so only the circuit structures of bank write circuit 1300a are set forth in detail. Bank write circuit 1300a is shown to include an two-input AND gate G1300 that receives the BANK0 signal and the REGREAD signal. The REGREAD signal, it will be recalled, is generated by the address latch 420, and indicates that latched address is the same as a current address. Thus, in the case of the write-followed-by-read operation discussed in the description, the output of gate G1300 will indicate the "same bank same address" case, previously described.

The bank write circuit 1300a is also shown to include a second two-input AND gate G1302 that receives the BANK0 signal by way of inverter I1300, as well as the READ signal. The output of AND gate G1302, therefore, indicates that the read operation is taking place at a memory bank different from that which the write operation has previously occurred. Thus, in such a case, the output of gate G1302 will by high. Notably, in the "same bank different address" case, the output of gate G1302 will remain low.

The output of gate G1302 is logically ORed with the STORE signal and the OTHER signal in a three-input OR gate G1304. The output of gate G1304, in turn, is further ORed with the output of gate G1300, in a two-input OR gate G1306. The output of gate G1306 provides the WRITE0 signal. In this manner, the WRITE0 signal is generated to enable a write to the first memory bank 402a (BANK0).

Thus, in the particular write enable circuit 446 of FIG. 13, during a read operation, when one of the WRITE0–n signals is driven low, the remainder of the WRITE0–n signals will be driven high, enabling the write circuits within the other local read/write circuits (428a–428n). For example, in a write to the first bank 402a followed by a read to the second bank 402b, the write circuits within read/write circuit 428b will be disabled (by a low WRITE0 signal) while the write circuits within the remainder of the read/write circuits (428a, 428n) will be enabled. To prevent data from being written into memory banks 402n other than the first memory bank 402a, decoding information can be used to de-select the memory banks. As just two examples, the column decoder 406n of the de-selected memory banks 428n could be disabled, or the row decoders 404n of the de-selected memory banks could maintain their respective word lines low (disabled).

It is understood, that while the preferred embodiment 400 sets forth a case in which the column address is initially latched for use in a subsequent internal write function, a row address may also be latched for a subsequent internal write function. Such an application may particularly advantageous in RAM employing multiple memory banks that can be enabled and disabled. The row address, column address, and input data, could be latched for a write operation to a memory bank that is initially disabled. Other operations could take place (such as read operations) as the memory bank is enabled. Once enabled, the latched row and column address could by applied, and the latched input data written into the memory bank with an internal write function, as described in detail above. In such an arrangement, the address latch of the preferred embodiment could include latches for row address bits, and the row buffer could selectively couple a current row address or latched row address to the row address bus.

It is also noted, that while the preferred embodiment illustrates a synchronous DRAM, the teaching set forth herein can be implemented in other memory types, such as static RAMs or electrically programmable and electrically erasable programmable read only memories. Such other memory types may not employ multiplexed address buses. In addition, RAMs responsive to asynchronous clock signals may benefit from aspects of the preferred embodiment. As just one example, DRAMs that read and write sequential sets of data by other clock signals, such as repeated applications of a CAS_ signal, could be capable of rapid write-followed-by-read operations according to the teachings set forth herein.

Accordingly, although the present invention has been described in detail, it should be understood that various changes, substitutions, and alterations could be made without departing from the spirit and scope of the invention as defined by the appended claims.

What is claimed is:

1. A random access memory, comprising:
 a plurality of memory banks;
 a plurality of local input/output (I/O) buses, each local I/O bus being associated with one of the memory banks;
 a global read bus;
 a global write bus;
 a plurality of local read/write circuits, each local read/write circuit being associated with one of the local I/O buses, and including:
  a plurality of write paths coupling the global write bus to the associated local I/O bus, each write path including an input data latch, and
  a plurality of read paths coupling the associated local I/O bus to the global read bus; and
 control circuitry for issuing a plurality of control signals, wherein in response to the plurality of control signals write data is written into a first one of the plurality of memory banks while at a same time read data is read out from a second one of the plurality of memory banks, wherein the first one of the plurality of memory banks is different than the second one of the plurality of memory banks.

2. The circuit of claim 1, wherein:
each memory bank includes a plurality of memory cell arrays.

3. The circuit of claim 2, wherein:
each memory cell array includes a plurality of dynamic random access memory cells.

4. The circuit of claim 1, further including:
at least one decoder coupled to each memory bank.

5. The circuit of claim 4, further including:
the at least one decoder is a column decoder.

6. The circuit of claim 4, further including:
a plurality of local address buses, each local address bus being coupled to an associated decoder.

7. The circuit of claim 6, wherein:
the local address buses are column address buses.

8. The circuit of claim 4, further including:
a global address bus for receiving a current address;
an address latch coupled to the global address bus, the address latch including a plurality of latches for storing a latched address; and
a buffer for coupling the current address or the latched address to at least one of the decoders in response to a plurality of control signals.

9. The circuit of claim 8, wherein:
the control signals include a read signal and write signal, the read signal coupling the current address to at least one of the decoders, the write signal coupling the latched address to at least one of the decoders.

10. The circuit of claim 8, wherein:
the address latch latches an address on the global address bus in response to the initiation of a write operation.

11. The circuit of claim 1, wherein:
the write path of each local read/write circuit includes a local write driver having
a local I/O node, and
a pull-up device that couples the local I/O node to a first logic level and a pull-down device that couples the local I/O node to a second logic level.

12. The circuit of claim 11, wherein:
each said local write driver further includes a first logic gate coupled to the pull-up device and a second logic gate coupled to the pull-down device.

13. The circuit of claim 1, wherein:
the write path of each local read/write circuit is enabled by an active write control signal and disabled by an inactive write control signal.

14. The circuit of claim 13, further including:
a write control circuit that generates a write control signal for each of the local read/write circuits, the write control circuit including logic circuits for placing the write control signal in an active state when a read operation from one bank follows a write operation to another bank.

15. The circuit of claim 14, wherein:
the logic circuit further places the write control signal in an active state when a read operation at an first address in a first bank follows a write operation to the same address in the first bank.

16. The circuit of claim 15, further including:
an address latch and compare circuit having latches for storing a latched address, and a comparators for comparing the latched address with a current address and providing a match indication signal in the event the latched address is the same as a current address.

17. The circuit of claim 16, wherein:
the compare circuit include
a plurality of bit comparators, each bit comparator receiving an address bit of the latched column address and an address bit of the current column address, and generating an active bit compare indication when the latched column address bit and the current column address bit are the same, and
a match indication circuit coupled to the bit comparators that generates the match indication signal when all of the bit comparators provide active bit compare indications.

18. A semiconductor memory device, comprising:
a plurality of data input/outputs (I/O) that receive data input values in a write operation and provide data output values in a read operation;
a global write bus that receives data input values from the data I/Os;
a global read bus that provides data output values to the data I/Os;
a plurality of local read/write circuits, each read/write circuit being coupled to the global write bus and global read bus, and including a plurality of storage circuits for storing data input values from the global write bus; and
control circuitry for issuing a plurality of control signals, wherein in response to the plurality of control signals write data provided by the global write bus to a first one of the plurality of local read/write circuits is written while at a same time read data is read out from a second one of the plurality of local read/write circuits to the read bus, wherein the first one of the plurality of local read/write circuits is different than the second one of the plurality of local read/write circuits.

19. The semiconductor memory device of claim 18, further including:
the data I/Os being coupled to the global write bus by a plurality of global write buffers.

20. The circuit of claim 19, wherein:
each global write buffer receives one data I/O as an input, and includes
a global write output node,
a write pull-up device that couples to a global output write node to a first logic level, and
a write pull-down device that couples the global output write node to a second logic level.

21. The circuit of claim 20, wherein:
each global write driver further includes a first logic gate coupled to the write pull-up device and a second logic gate coupled to the write pull-down device, each logic gate being coupled to a write enable signal and the one data I/O.

22. The semiconductor memory device of claim 18, wherein:
the data I/Os include a plurality of global I/O lines; and
the global write bus includes global write bus lines, the number of global write bus lines being a multiple of the number of global I/O lines.

23. The semiconductor memory device of claim 22, further including:

a write multiplexer for coupling the global I/O lines to selected of the global write bus lines in response to at least one steering signal.

24. The semiconductor memory device of claim 18, wherein:

the data I/Os include a plurality of I/O lines; and the global read bus includes global read bus lines, the number of global read bus lines being a multiple of the number of global I/O lines.

25. The semiconductor memory device of claim 24, further including:

a read multiplexer for coupling selected of the global read bus lines to the global I/O lines in response to at least one steering signal.

26. The semiconductor memory device of claim 18, further including:

the global read bus being coupled to the data I/Os by a plurality of read buffers.

27. The circuit of claim 26, wherein:

each read buffer receives and input signal from the global read bus, and includes
  a data I/O node,
  a read pull-up device that couples the data I/O node to a first logic level, and
  a read pull-down device that couples the data I/O node to a second logic level.

28. The circuit of claim 27, wherein:

each read buffer further includes a first logic gate coupled to the read pull-up device and a second logic gate coupled to the read pull-down device, a read enable signal and the input signal from the global bus, being provided as inputs to the first and second logic gates.

29. The circuit of claim 18, wherein:

each read/write circuit is coupled to the global write bus and read bus by a plurality of read/write paths, each read/write path including a latch for storing the data input values.

30. The circuit of claim 29, wherein:

each read/write path further includes a local write driver circuit that, when enabled, drives a local I/O line in response to the data value stored within its respective latch.

31. The circuit of claim 29, wherein:

the global read bus includes a plurality of global read bus lines; and each read/write path further includes a local read driver circuit that, when enabled, drives one of the read bus lines in response to an output data value on a local I/O lines.

32. The random access memory of claim 1 wherein in response to the plurality of control signals write data is written into the first one of the plurality of memory banks from the local read/write circuit associated with the local I/O bus associated with the first one of the plurality of memory banks while at the same time read data is read out from the second one of the plurality of memory banks to the global read bus.

33. The random access memory of claim 1 wherein the global write bus is separate from the global read bus.

34. The semiconductor memory device of claim 18 wherein the global write bus is separate from the global read bus.

35. The random access memory of claim 1 wherein each of said local I/O buses is associated with one and only one read/write circuits.

* * * * *